(12) United States Patent
Ho et al.

(10) Patent No.: US 9,899,285 B2
(45) Date of Patent: Feb. 20, 2018

(54) SEMICONDUCTOR DEVICE AND METHOD OF FORMING SMALL Z SEMICONDUCTOR PACKAGE

(71) Applicant: Semtech Corporation, Camarillo, CA (US)

(72) Inventors: Kok Khoon Ho, San Jose, CA (US); Satyamoorthi Chinnusamy, San Jose, CA (US)

(73) Assignee: Semtech Corporation, Camarillo, CA (US)

( * ) Notice: Subject to any disclaimer, the term of this patent is extended or adjusted under 35 U.S.C. 154(b) by 22 days.

(21) Appl. No.: 14/814,384

(22) Filed: Jul. 30, 2015

(65) Prior Publication Data

US 2017/0033026 A1   Feb. 2, 2017

(51) Int. Cl.
  *H01L 23/31* (2006.01)
  *H01L 23/367* (2006.01)
  (Continued)

(52) U.S. Cl.
  CPC ........ *H01L 23/3128* (2013.01); *H01L 21/486* (2013.01); *H01L 21/56* (2013.01); *H01L 23/367* (2013.01); *H01L 23/481* (2013.01); *H01L 23/49827* (2013.01); *H01L 23/5389* (2013.01); *H01L 23/562* (2013.01); *H01L 24/19* (2013.01); *H01L 24/20* (2013.01); *H01L 24/96* (2013.01); *H01L 24/97* (2013.01); *H01L 25/105* (2013.01); *H01L 25/50* (2013.01); *H01L 21/561* (2013.01); *H01L 21/568* (2013.01); *H01L 23/49816* (2013.01); *H01L 2224/0401* (2013.01); *H01L 2224/04105* (2013.01); *H01L 2224/12105* (2013.01); *H01L 2224/16146* (2013.01); *H01L 2224/32145* (2013.01); *H01L 2224/32245* (2013.01); *H01L 2224/73204* (2013.01); *H01L 2224/73259* (2013.01);
  (Continued)

(58) Field of Classification Search
  CPC ............................ H01L 23/3128; H01L 21/56

USPC .......................................... 257/774; 438/127
See application file for complete search history.

(56) References Cited

U.S. PATENT DOCUMENTS

| | | | |
|---|---|---|---|
| 9,443,762 B2* | 9/2016 | Marimuthu | ........... H01L 21/561 |
| 2004/0113283 A1* | 6/2004 | Farnworth | .......... H01L 21/3043 257/782 |
| 2011/0012258 A1* | 1/2011 | Omandam | ......... B23K 26/0042 257/737 |
| 2011/0049695 A1* | 3/2011 | Shin | ...................... H01L 21/561 257/686 |
| 2011/0101524 A1* | 5/2011 | Camacho | ............ H01L 21/6835 257/737 |
| 2011/0278736 A1* | 11/2011 | Lin | ......................... H01L 25/50 257/774 |
| 2011/0316146 A1* | 12/2011 | Pagaila | .................... H01L 24/19 257/737 |
| 2012/0217629 A1* | 8/2012 | Cho | ........................ H01L 25/16 257/692 |
| 2012/0326337 A1* | 12/2012 | Camacho | ................ H01L 24/19 257/782 |
| 2013/0037935 A1* | 2/2013 | Xue | .................. H01L 21/76898 257/737 |
| 2013/0210239 A1* | 8/2013 | Kim | ...................... H01L 21/563 438/759 |

(Continued)

*Primary Examiner* — Moazzam Hossain
(74) *Attorney, Agent, or Firm* — Robert D. Atkins; Patent Law Group: Atkins and Associates, P.C.

(57) ABSTRACT

A semiconductor device has a plurality of first semiconductor die. A plurality of first bumps is formed over the first semiconductor die. A first protection layer is formed over the first bumps. A portion of the first semiconductor die is removed in a backgrinding operation. A backside protection layer is formed over the first semiconductor die. An encapsulant is deposited over the first semiconductor die and first bumps. A portion of the encapsulant is removed to expose the first bumps. A conductive layer is formed over the first bumps and encapsulant. An insulating layer and plurality of second bumps are formed over the conductive layer. A plurality of conductive vias is formed through the encapsulant. A plurality of the semiconductor devices is stacked with the conductive vias electrically connecting the stacked semiconductor devices. A second semiconductor die having a through silicon via is disposed over the first semiconductor die.

25 Claims, 12 Drawing Sheets

(51) Int. Cl.

| | | |
|---|---|---|
| *H01L 23/48* | (2006.01) | |
| *H01L 21/56* | (2006.01) | |
| *H01L 23/538* | (2006.01) | |
| *H01L 23/00* | (2006.01) | |
| *H01L 25/10* | (2006.01) | |
| *H01L 25/00* | (2006.01) | |
| *H01L 21/48* | (2006.01) | |
| *H01L 23/498* | (2006.01) | |

(52) U.S. Cl.
 CPC ............ *H01L 2224/73267* (2013.01); *H01L 2224/83005* (2013.01); *H01L 2224/92125* (2013.01); *H01L 2224/92244* (2013.01); *H01L 2224/94* (2013.01); *H01L 2225/1035* (2013.01); *H01L 2225/1058* (2013.01); *H01L 2924/1033* (2013.01); *H01L 2924/10252* (2013.01); *H01L 2924/10253* (2013.01); *H01L 2924/10272* (2013.01); *H01L 2924/10322* (2013.01); *H01L 2924/10324* (2013.01); *H01L 2924/10329* (2013.01); *H01L 2924/10335* (2013.01); *H01L 2924/141* (2013.01); *H01L 2924/143* (2013.01); *H01L 2924/1433* (2013.01); *H01L 2924/1434* (2013.01); *H01L 2924/1461* (2013.01); *H01L 2924/14335* (2013.01); *H01L 2924/18161* (2013.01); *H01L 2924/18162* (2013.01); *H01L 2924/3511* (2013.01)

(56) References Cited

U.S. PATENT DOCUMENTS

| | | | |
|---|---|---|---|
| 2013/0228917 A1* | 9/2013 | Yoon | H01L 23/49811 257/737 |
| 2014/0103527 A1* | 4/2014 | Marimuthu | H01L 23/3121 257/737 |
| 2014/0377909 A1* | 12/2014 | Chung | H01L 21/561 438/113 |
| 2015/0187607 A1* | 7/2015 | Huang | H01L 21/565 438/126 |
| 2015/0380357 A1* | 12/2015 | Liu | H01L 23/544 257/737 |
| 2016/0118333 A1 | 4/2016 | Lin | |

\* cited by examiner

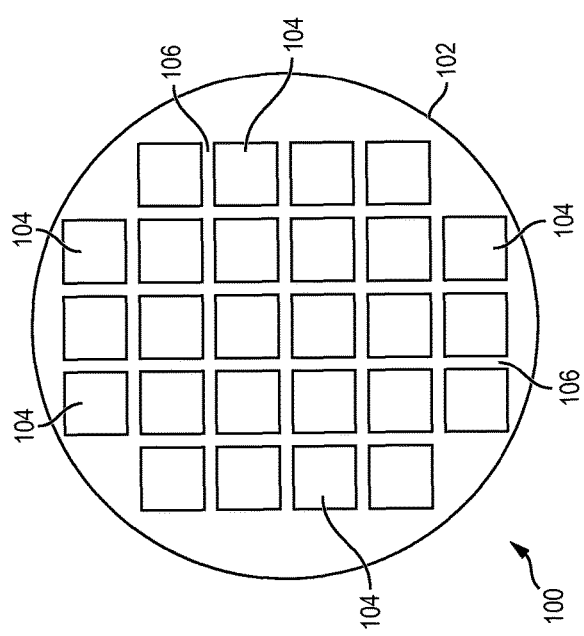
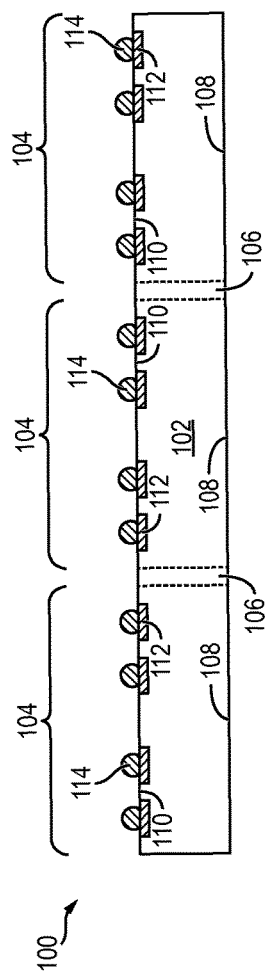
FIG. 1a
FIG. 1b

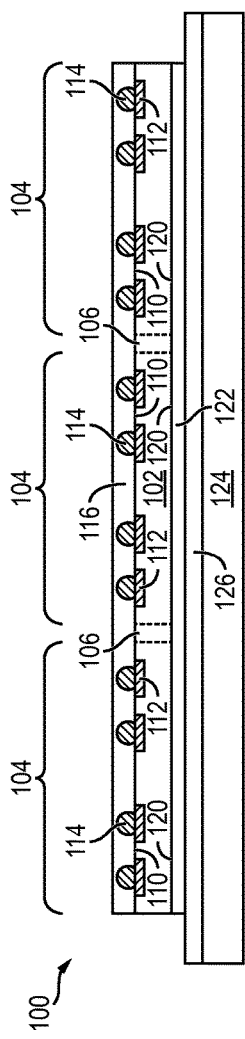
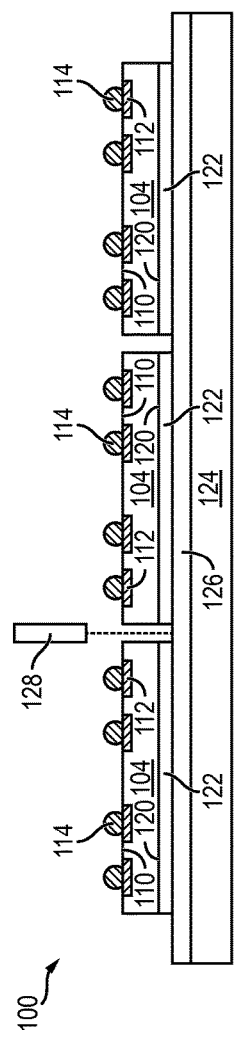
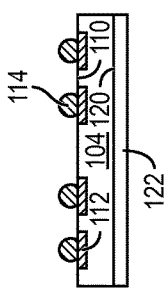
FIG. 1f
FIG. 1g
FIG. 1h

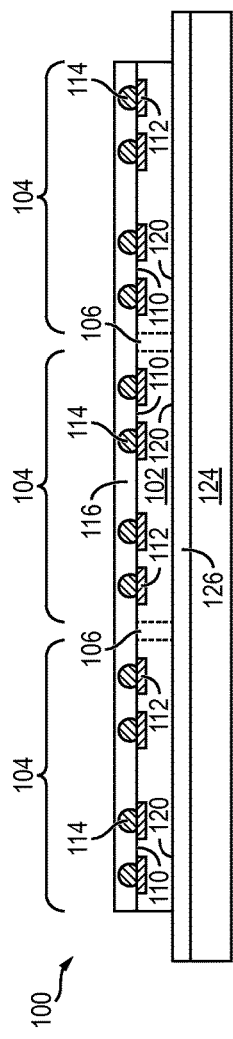
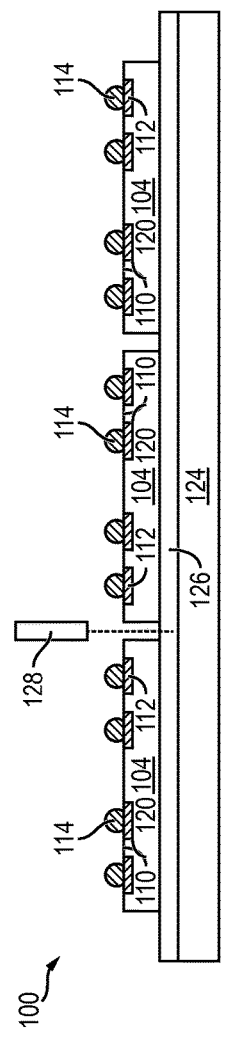
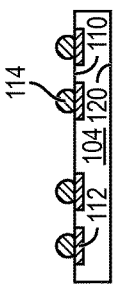
FIG. 2a
FIG. 2b
FIG. 2c

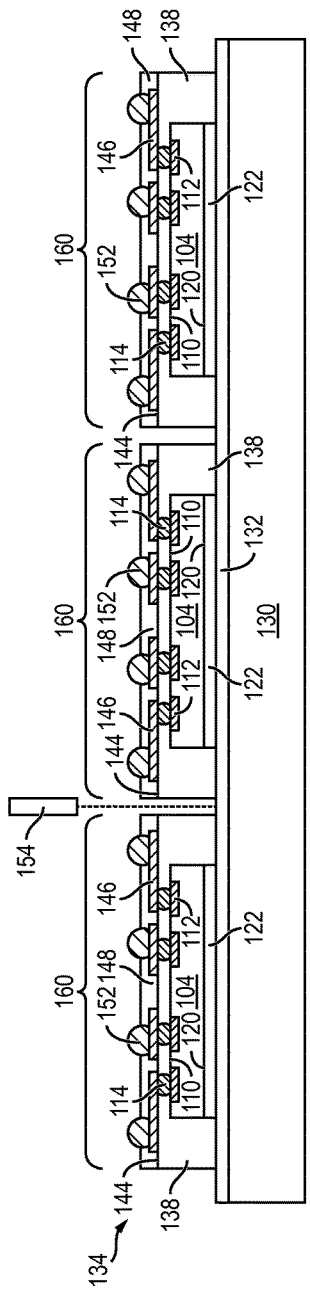
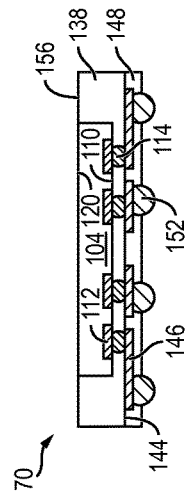
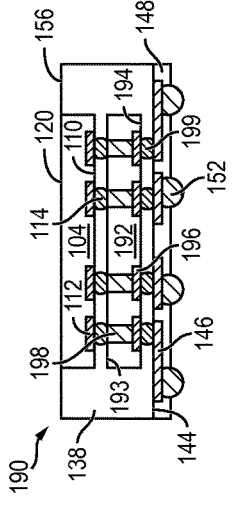
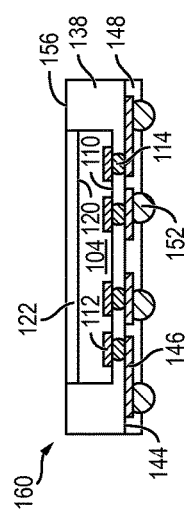
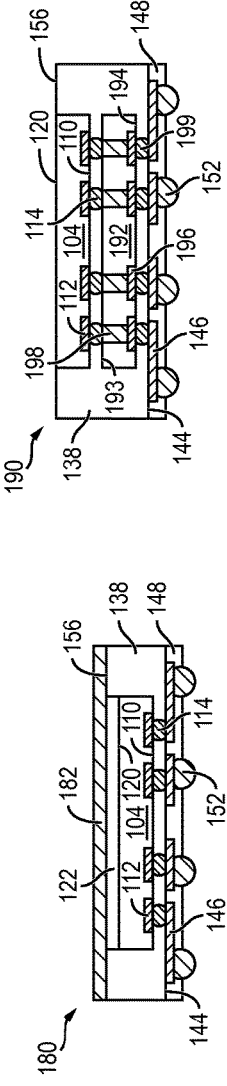

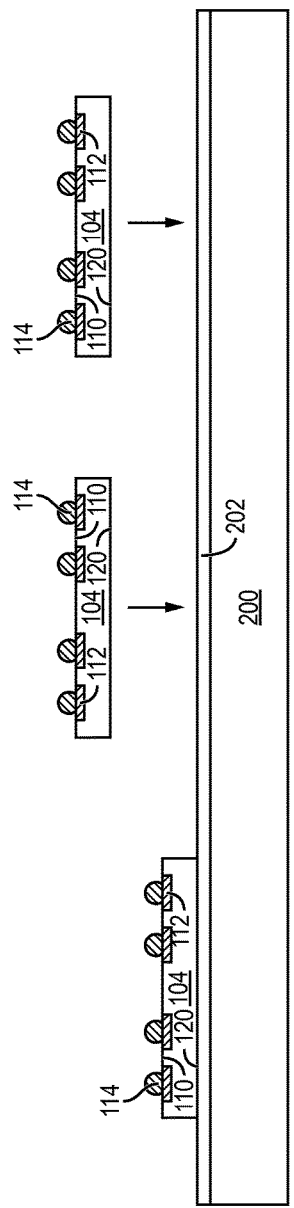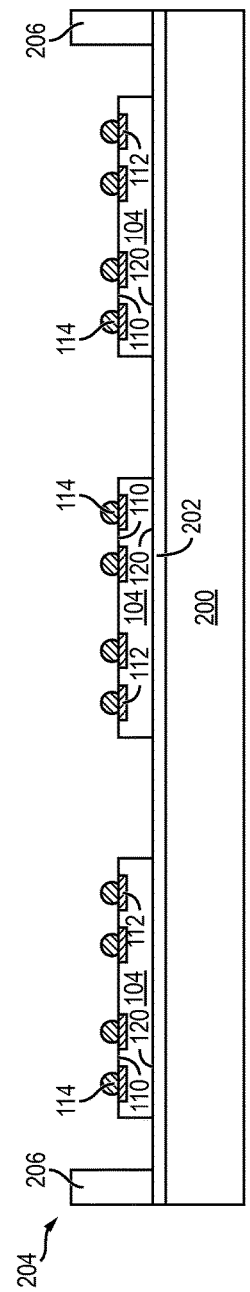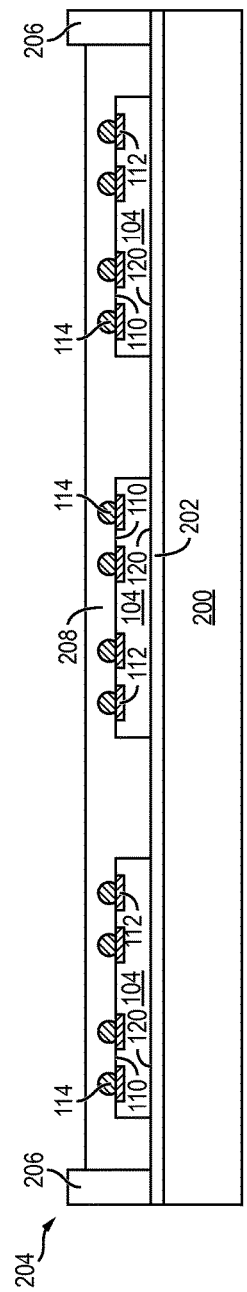

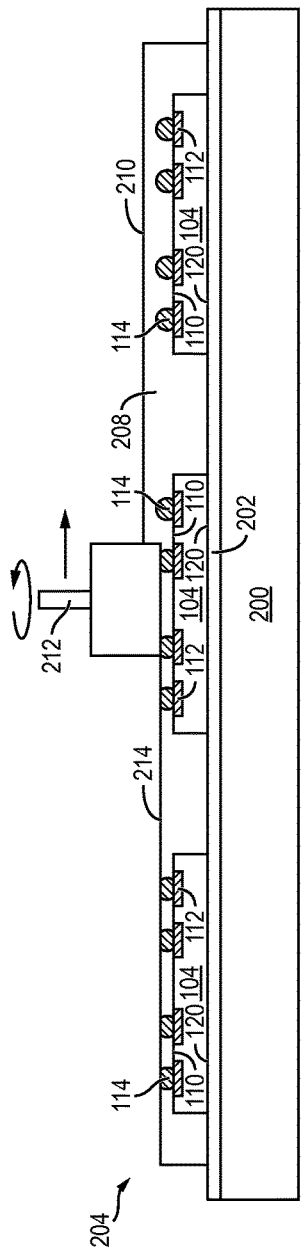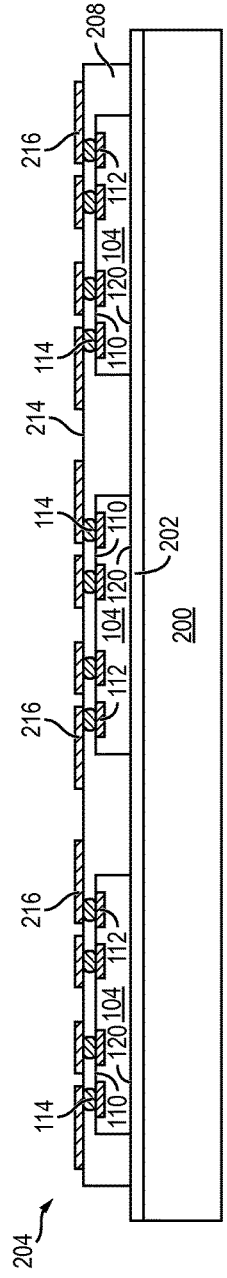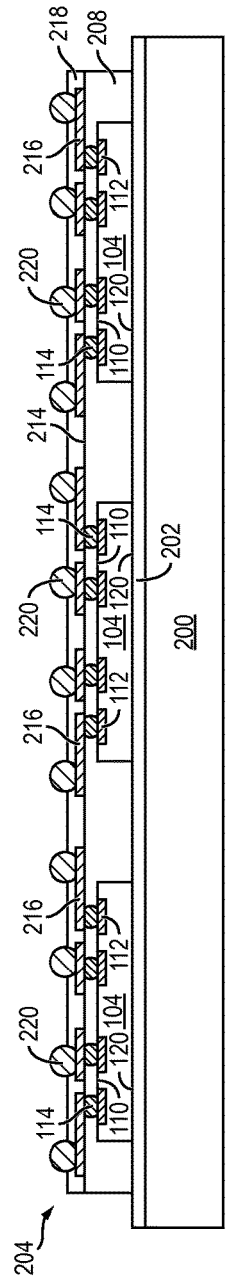

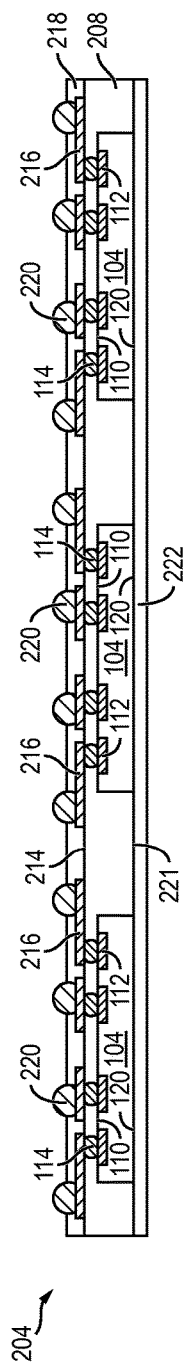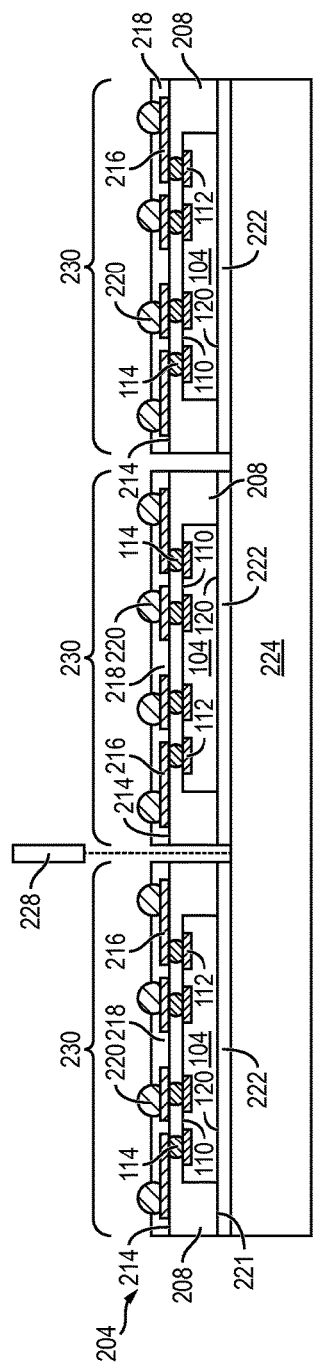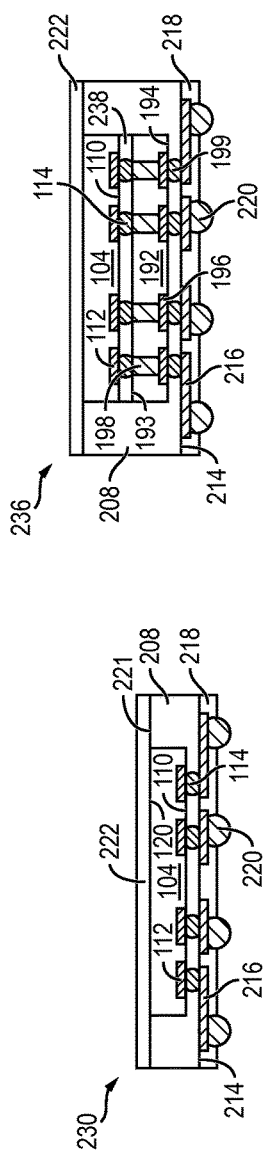

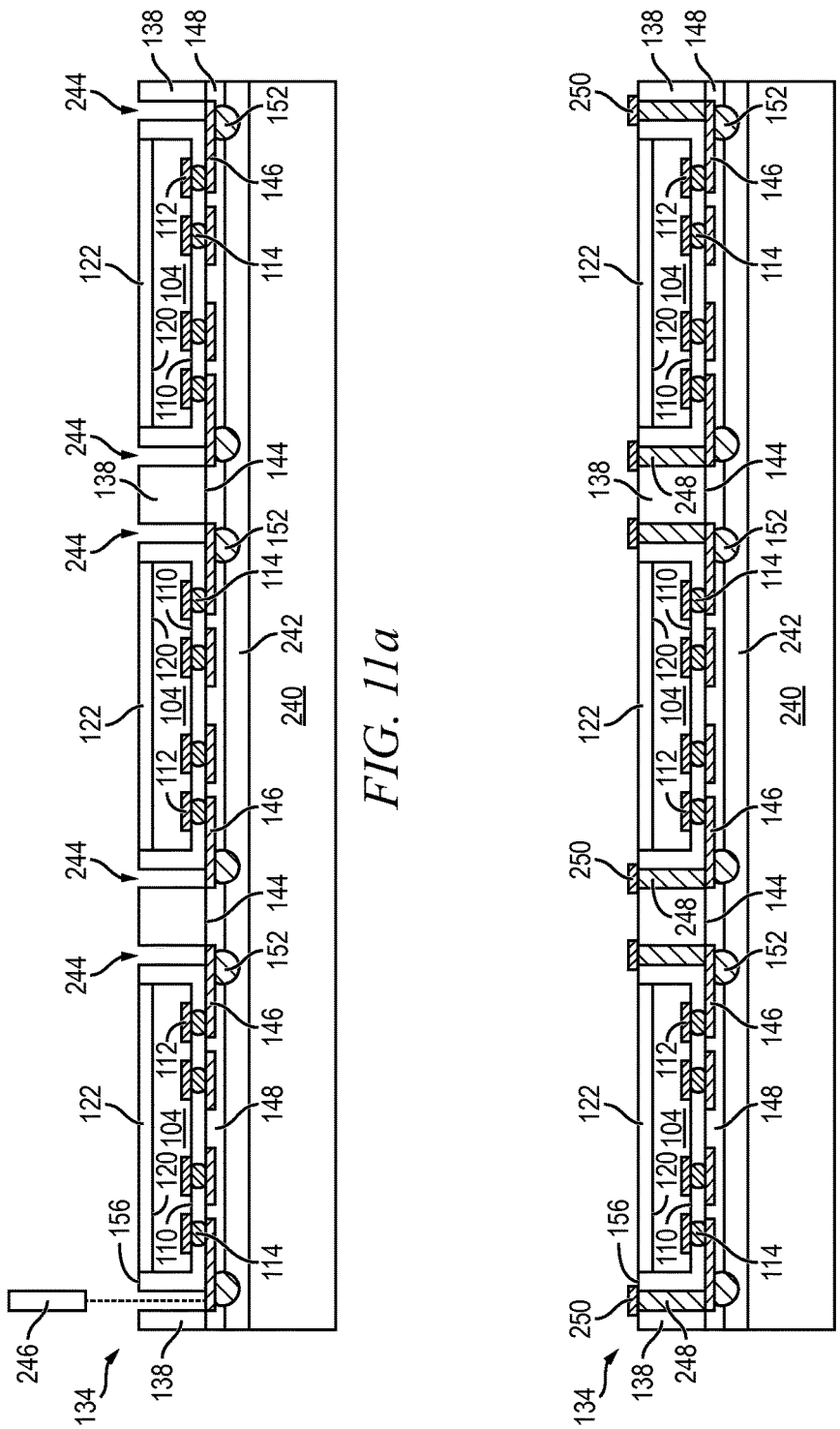

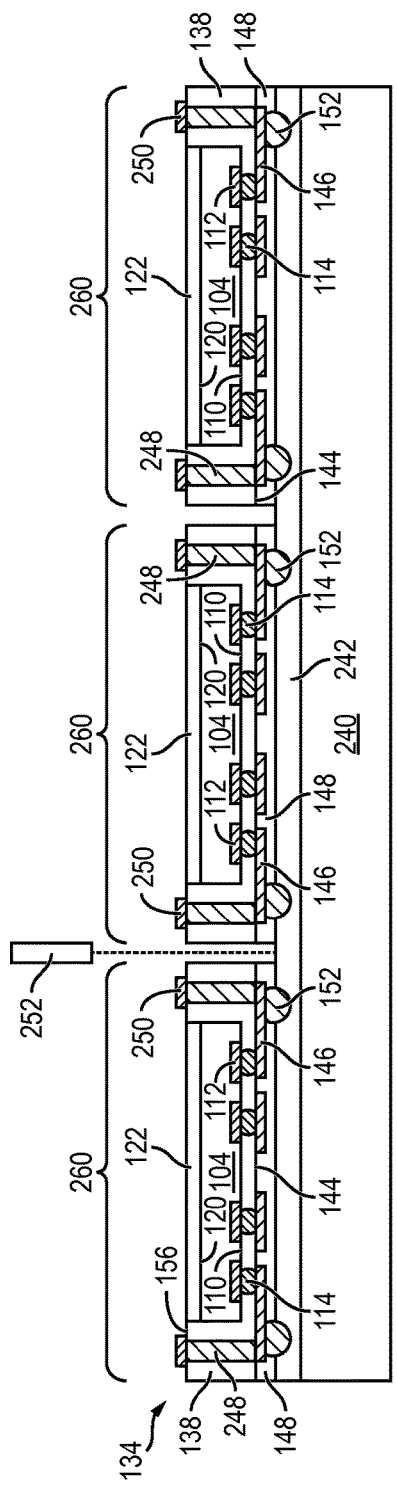
FIG. 11c
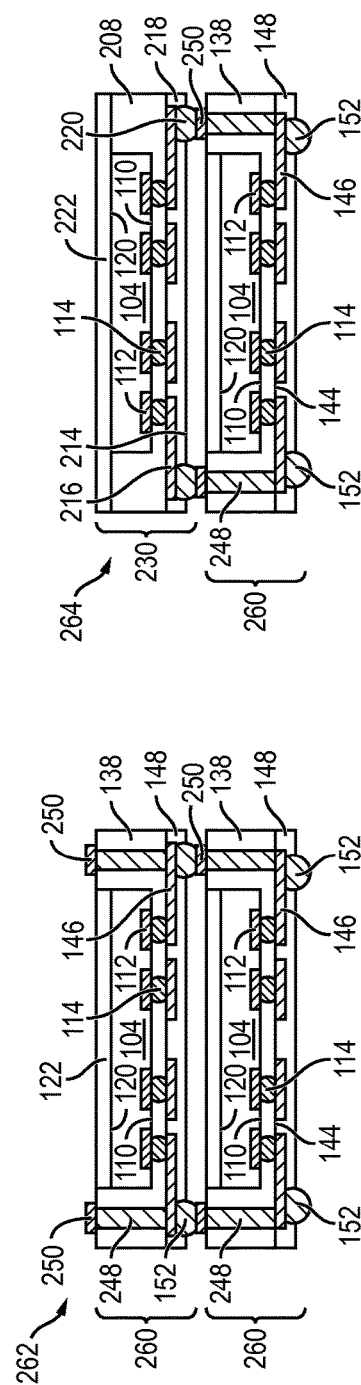
FIG. 12
FIG. 13

SEMICONDUCTOR DEVICE AND METHOD OF FORMING SMALL Z SEMICONDUCTOR PACKAGE

FIELD OF THE INVENTION

The present invention relates in general to semiconductor devices and, more particularly, to a semiconductor device and method of forming a semiconductor package having a reduced z-dimension.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, and various signal processing circuits.

Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows the material's electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support, electrical interconnect, and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and are produced more efficiently. In addition, smaller semiconductor devices have a smaller footprint, which is desirable for smaller end products. A smaller semiconductor die size is achieved by improvements in the front-end process resulting in semiconductor die with smaller, higher density active and passive components. Enhancements in the back-end process also result in semiconductor devices with smaller footprints and are achieved by improving electrical interconnection and packaging materials. A reduced package profile is of particular importance for packaging in the cellular or smart phone industry.

Reduction in package size is achieved by decreasing package footprint, i.e., by decreasing the x and y dimensions of a package. Reduction in package size is also achieved by decreasing package height or thickness, i.e., by decreasing a z-dimension of the package. Decrease in z-dimension is accomplished by reducing a thickness of the semiconductor die within the package. However, reducing semiconductor die thickness increases the fragility of the semiconductor die, making the semiconductor die and overall package more susceptible to damage. Further, forming packages with reduced thickness often involves time-consuming manufacturing processes that increase overall cost and reduce throughput.

SUMMARY OF THE INVENTION

A need exists to form a robust semiconductor device with a reduced thickness while decreasing manufacturing time and cost. Accordingly, in one embodiment, the present invention is a method of making a semiconductor device comprising the steps of providing a plurality of first semiconductor die including a plurality of bumps formed over the first semiconductor die, forming a protection layer over the first semiconductor die opposite the bumps, depositing an encapsulant over the first semiconductor die, removing a portion of the encapsulant from over the bumps, and forming a conductive layer over the bumps and encapsulant.

In another embodiment, the present invention is a method of making a semiconductor device comprising the steps of providing a first semiconductor die, forming a first protection layer over the first semiconductor die, depositing an encapsulant over the first semiconductor die, removing a portion of the encapsulant from over the first semiconductor die, and forming a first conductive layer over a first surface of the encapsulant.

In another embodiment, the present invention is a method of making a semiconductor device comprising the steps of providing a first semiconductor die, depositing an encapsulant over the first semiconductor die, removing a portion of the encapsulant from over the first semiconductor die, and forming a conductive layer over the encapsulant.

In another embodiment, the present invention is a semiconductor device comprising a first semiconductor die and a protection layer formed over the first semiconductor die. An encapsulant is deposited around the first semiconductor die. A conductive layer is formed over the first semiconductor die opposite the protection layer.

BRIEF DESCRIPTION OF THE DRAWINGS

FIGS. 1a-1h illustrate a method of forming a protection layer over a semiconductor die;

FIGS. 2a-2c illustrate a method of forming a semiconductor die with an exposed back surface;

FIGS. 3a-3g illustrate a method of forming a semiconductor device having a backside protection layer formed over the semiconductor die;

FIG. 4 illustrates a semiconductor device having a backside protection layer formed over the semiconductor die;

FIG. 5 illustrates a semiconductor device having a semiconductor die with an exposed back surface;

FIG. 6 illustrates a semiconductor device with a heat spreader disposed over the semiconductor die;

FIG. 7 illustrates a semiconductor device having stacked semiconductor die;

FIGS. 8a-8h illustrate a method of making a semiconductor device having a protection layer disposed across a surface of the semiconductor device;

FIG. 9 illustrates a semiconductor device having a protection layer disposed across a surface of the semiconductor device;

FIG. 10 illustrates a semiconductor device having stacked semiconductor die with a protection layer formed across a surface of the semiconductor device;

FIGS. 11a-11c illustrate a method of forming semiconductor devices having conductive vias for electrically connecting stacked devices;

FIG. 12 illustrates a semiconductor package having a plurality of semiconductor devices in an open semiconductor device stack; and FIG. 13 illustrates a semiconductor package having a plurality of semiconductor devices in a closed semiconductor device stack.

DETAILED DESCRIPTION OF THE DRAWINGS

Figure 1C:
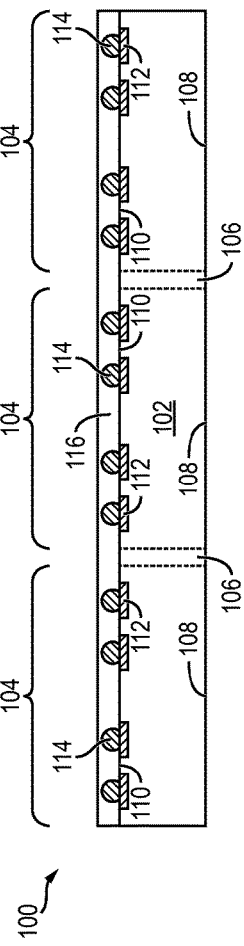

The present invention is described in one or more embodiments in the following description with reference to the figures, in which like numerals represent the same or similar elements. While the invention is described in terms of the best mode for achieving objectives of the invention, those skilled in the art will appreciate that the disclosure is intended to cover alternatives, modifications, and equivalents as are included within the spirit and scope of the invention as defined by the appended claims and claim equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections are made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1a shows semiconductor wafer 100 with a base substrate material 102, such as silicon, germanium, aluminum phosphide, aluminum arsenide, gallium arsenide, gallium nitride, indium phosphide, silicon carbide, or other bulk semiconductor material for structural support. A plurality of semiconductor die or components 104 is formed on wafer 100 separated by a non-active, inter-die wafer area or saw street 106 as described above. Saw street 106 provides cutting areas to singulate semiconductor wafer 100 into individual semiconductor die 104.

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit includes one or more transistors, diodes, and other circuit elements formed within active surface 110 to implement analog circuits or digital circuits, such as digital signal processor (DSP), ASIC, MEMS, memory, or other signal processing circuit. Semiconductor die 104 also contains integrated passive devices (IPDs), such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 includes one or more layers of aluminum (Al), copper (Cu), tin (Sn), nickel (Ni), gold (Au), silver (Ag), Palladium (Pd), SnAg, SnAgCu, CuNi, CuNiAu, CuNiPdAu, or other suitable electrically conductive material or combination thereof. Conductive layer 112 operates as contact pads electrically connected to the circuits on active surface 110. Contact pads 112 facilitate subsequent electrical interconnect between active circuits within semiconductor die 104 and external devices, for example, a printed circuit board (PCB).

An electrically conductive bump material is deposited over contact pads 112 using an evaporation, electrolytic plating, electroless plating, ball drop, or screen printing process. The bump material is Al, Sn, Ni, Au, Ag, lead (Pb), bismuth (Bi), Cu, solder, and combinations thereof, with an optional flux solution. For example, the bump material is eutectic Sn/Pb, high-lead solder, or lead-free solder. The bump material is bonded to contact pads 112 using a suitable attachment or bonding process. The bump material is reflowed by heating the material above the material's melting point to form balls or bumps 114. In some applications, bumps 114 are reflowed a second time to improve the electrical connection with contact pads 112. Bumps 114 can also be compression bonded or thermocompression bonded to contact pads 112. Bumps 114 represent one type of interconnect structure formed over contact pads 112. The interconnect structure can also use stud bump, micro bump, or other electrical interconnect.

In FIG. 1c, a temporary protection layer 116 is formed over bumps 114 and wafer 100 using lamination, screen printing, spin coating, spray coating, or other suitable method. Temporary protection layer 116 contains one or more layers of photoresist, liquid coating material, dry film, polymer film, polymer composite, or other material having properties of compliance, structural support, thermal stability, and easy strip. Protection layer 116 covers bumps 114 and active surface 110. In one embodiment, protection layer 116 is a backgrinding tape. Protection layer 116 is a sacrificial layer used to provide structural support and protect active surface 110 during subsequent manufacturing processes, for example, during backgrinding of wafer 100. After depositing protection layer 116, additional treatments, such as UV exposure and heating processes, are applied to provide necessary adhesion and mechanical properties.

Figure 1D:
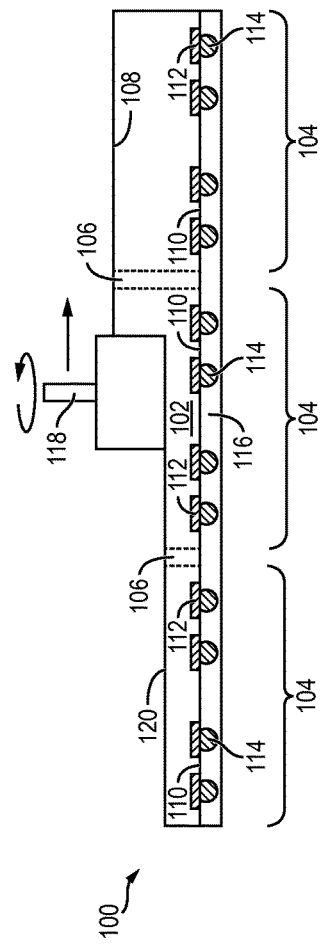

In FIG. 1d, backside surface 108 of wafer 100 undergoes a backgrinding operation with grinder 118 to reduce a thickness of semiconductor die 104. The backgrinding operation removes a portion of base substrate material 102 from surface 108 and leaves semiconductor die 104 with a new backside surface 120. A chemical etch, plasma etch, chemical mechanical planarization (CMP), or laser direct ablation (LDA) process is used to remove the portion of base substrate material 102. In one embodiment, the backgrinding operation reduces a thickness of semiconductor die 104 to 25-300 micrometers (μm), i.e., semiconductor die 104 have z-dimension of between 25-300 μm after backgrinding. Protection layer 116 protects active surface 110 during the backgrinding operation and prevents grinding debris from contaminating contact pads 112 and the devices within active surface 110. Protection layer 116 also supports semiconductor die 104 structurally during and after the backgrinding operation. The structural support provided by protection layer 116 allows a greater portion of base substrate material 102 to be removed from surface 108.

Figure 1E:
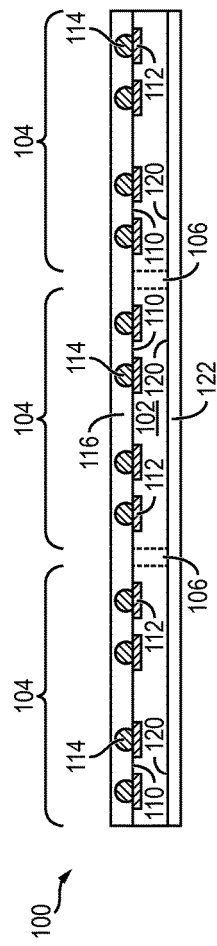

In FIG. 1e, a backside protection layer 122 is formed on surface 120 of semiconductor die 104. Backside protection layer 122 is formed by lamination, screen printing, spin coating, spray coating, or other suitable method. Backside protection layer 122 is one or more layers of photosensitive polymer dielectric film with or without fillers, non-photosensitive polymer dielectric film, epoxy, epoxy resin, polymeric materials, polymer composite material such as epoxy resin with filler, epoxy acrylate with filler, or polymer with proper filler, thermoset plastic laminate, or other material having similar insulating and structural properties. Backside protection layer 122 is non-conductive and environmentally protects the backside surface 120 of semiconductor die 104. Backside protection layer also provides structural support to increase the rigidity and decrease the fragileness of semiconductor die 104. Backside protection layer 122 can also provide heat dissipation to improve the thermal performance of the semiconductor device. Backside protection layer 122 can also provide a warpage tuning capability to control overall package warpage.

In FIG. 1f, semiconductor wafer 100 is disposed over an interface layer or double-sided tape 126. Interface layer 126 is held in place by a film frame or temporary carrier 124. Interface layer 126 is formed over film frame 124 as a temporary adhesive bonding film, etch-stop layer, or release layer. Wafer 100 is mounted to interface layer 126 with backside protection layer 122 oriented toward and contacting interface layer 126.

Film frame 124, interface layer 126, and wafer 100 are heated in an oven or with a hot plate at a temperature and for a duration of time sufficient to release protection layer 116 and expose bumps 114 and active surface 110. If backside protection layer 122 is not fully cured when protection layer 116 releases, wafer 100, film frame 124, and interface layer 126 are allowed to continue baking at a temperature and for a duration of time sufficient to allow backside protection layer 122 to fully cure.

FIG. 1g shows semiconductor wafer 100 after the removal of protection layer 116. Semiconductor wafer 100 is singulated through saw street 106 using a saw blade or laser cutting tool 128 into individual semiconductor die 104. Alternatively, semiconductor die 104 is singulated using a chemical or plasma etching process.

FIG. 1h shows semiconductor die 104 after singulation. Backside protection layer 122 is formed on back surface 120 of semiconductor die 104. Backside protection layer 120 protects back surface 120 from contaminants and strengthens semiconductor die 104 physically. Semiconductor die 104 are then cleaned, dried, and irradiated. The cleaning process includes a spin rinse drying (SRD) process, plasma clean process, dry clean process, wet clean process, or a combination thereof. Semiconductor die 104 is inspected and electrically tested for identification of known good die (KGD) either prior to or post singulation. The cleaned and inspected semiconductor die 104 are then loaded into pick and place equipment for further processing.

FIGS. 2a-2c show a method of forming semiconductor die 104 having an exposed backside surface 120. Continuing from FIG. 1d, semiconductor wafer 100 is disposed over interface layer 126 and film frame 124. FIG. 2a shows semiconductor wafer 100 mounted over film frame 124 with back surface 120 oriented toward and in contact with interface layer 126.

Film frame 124, interface layer 126, and wafer 100 are heated in an oven or with a hot plate at a temperature and for a duration of time sufficient to release protection layer 116 and expose bumps 114 and active surface 110. FIG. 2b shows semiconductor wafer 100 after the removal of protection layer 116. Semiconductor wafer 100 is singulated through saw street 106 using a saw blade or laser cutting tool 128 into individual semiconductor die 104. Alternatively, semiconductor die 104 is singulated using a plasma or chemical etching process.

FIG. 2c shows semiconductor die 104 after singulation. Semiconductor die 104 have an exposed backside surface 120. The individual semiconductor die 104 are then cleaned, dried, and irradiated. The cleaning process includes a SRD process, plasma clean process, dry clean process, wet clean process, or a combination of thereof. Semiconductor die 104 is inspected and electrically tested for identification of KGD post singulation. The cleaned and inspected semiconductor die 104 are then loaded into pick and place equipment for further processing.

Figure 3A:
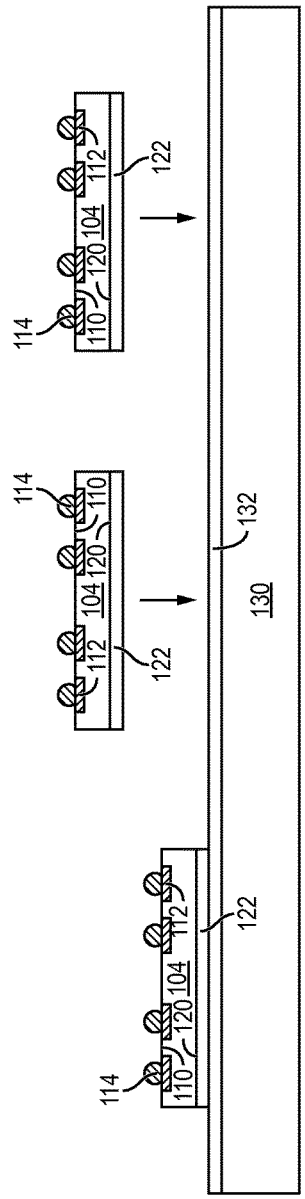

FIGS. 3a-3g show a method of forming a semiconductor device having a backside protection layer formed over the semiconductor die. FIG. 3a shows a cross-sectional view of a portion of a carrier or temporary substrate 130 containing sacrificial base material such as silicon, polymer, beryllium oxide, glass, or other suitable low-cost, rigid material for structural support. An interface layer or double-sided tape 132 is formed over carrier 130 as a temporary adhesive bonding film, etch-stop layer, or thermal release layer. Semiconductor die 104 from FIG. 1h are disposed over carrier 130 and interface layer 132 using, for example, a pick and place operation with backside protection layer 122 oriented toward the carrier.

Figure 3B:
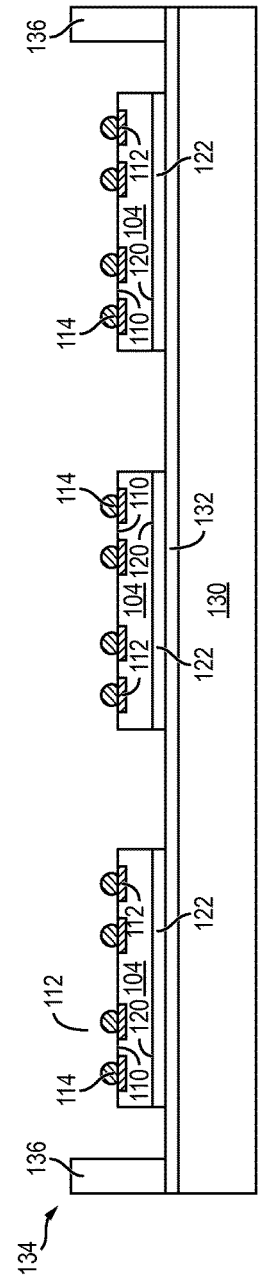

FIG. 3b shows semiconductor die 104 mounted to interface layer 132 and carrier 130 as reconstituted or reconfigured wafer 134. Bumps 114 are oriented away from carrier 130. Semiconductor die 104 are held in place over carrier 130 by interface layer 132. A re-usable guard ring 136 is disposed around semiconductor die 104.

Figure 3C:
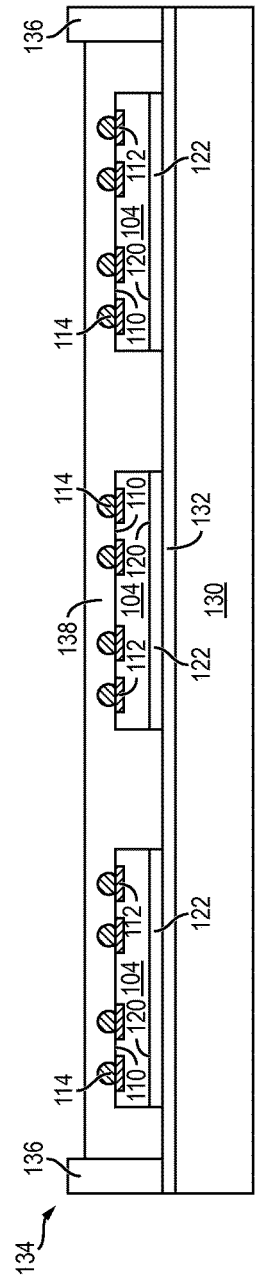

In FIG. 3c, an encapsulant or molding compound 138 is deposited over semiconductor die 104 and carrier 130 using screen printing, spray coating, paste printing, compressive molding, transfer molding, liquid encapsulant molding, vacuum lamination, spin coating, or other suitable application method. Encapsulant 138 is deposited around semiconductor die 104 and covers bumps 114, active surface 110, and the four side surfaces of semiconductor die 104. Encapsulant 138 includes polymer composite material, such as epoxy resin with filler, epoxy acrylate with filler, or polymer with proper filler. Encapsulant 138 is non-conductive and environmentally protects the semiconductor die 104 from external elements and contaminants.

Figure 3D:
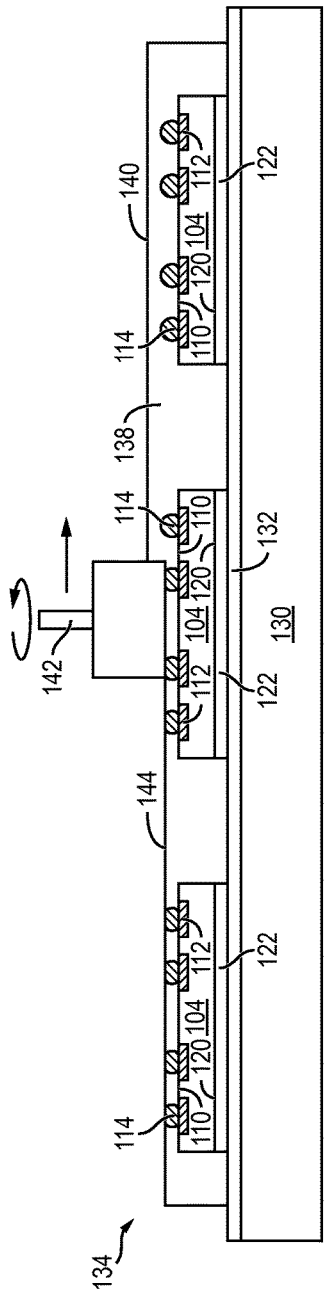

In FIG. 3d, guard ring 136 is removed and surface 140 of encapsulant 138 undergoes a grinding operation to planarize encapsulant 138 and expose bumps 114. Grinder 142 removes a portion of encapsulant 138 from surface 140. The grinding operation reveals a portion of bumps 114 and leaves encapsulant with planarized surface 144. After grinding, surface 144 is coplanar with bumps 114.

Figure 3E:
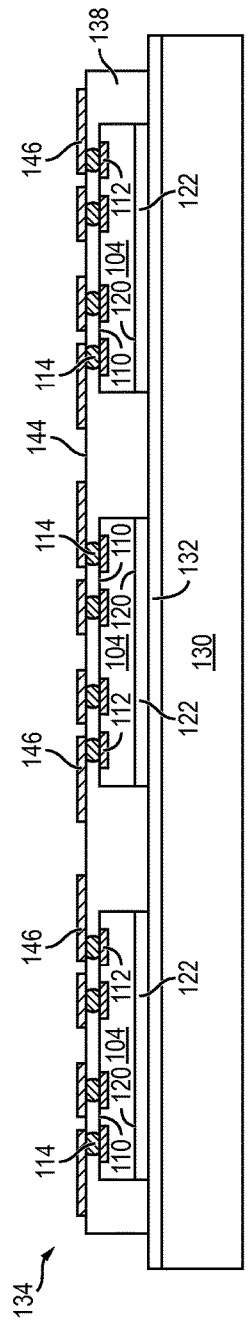

In FIG. 3e, an electrically conductive layer 146 is formed over bumps 114 and surface 144 of encapsulant 138 using a patterning and metal deposition process such as printing, PVD, CVD, sputtering, electrolytic plating, and electroless plating. Conductive layer 146 is one or more layers of Al, Cu, Sn, Ni, Au, Ag, or other suitable electrically conductive material. Conductive layer 146 operates as a redistribution layer (RDL) formed over semiconductor die 104. Conductive layer 146 provides a conductive path extending from bumps 114 to other areas over semiconductor die 104 and encapsulant 138. One portion of conductive layer 146 is electrically connected to bumps 114. Other portions of conductive layer 146 are electrically common or electrically isolated depending on the design and function of semiconductor die 104.

In one embodiment, after exposing bumps 114, conductive layer 146 is formed by placing reconstituted wafer 134 into a high-speed nano particle jet or laser printer. The traces of conductive layer 146 are then printed directly over bumps 114 and encapsulant 138 in the desired patterned. Nano Cu or Ag traces are used to form conductive layer 146. After the printing is completed, the traces are cured or sintered. Alternatively, the traces are sintered simultaneously, in real-time, with the printing.

In another embodiment, after exposing bumps 114, a desmearing operation is performed on bumps 114 and surface 144 of encapsulant 138. After desmearing, the encapsulated semiconductor die 104 are dried in an oven. After drying, an electroless plating operation is performed. Next, a dry film lamination process is performed, followed by dry film patterning and electro Cu-plating. The dry film is then removed and a flash etching and annealing process are performed to complete the formation of conductive layer 146 over bumps 114 and encapsulant 138.

In another embodiment, conductive layer 146 is formed by depositing a screen coating or photoresist layer across exposed bumps 114 and surface 144 of encapsulant 138 using spray coating, spin coating, or other suitable application process. The reconstituted wafer is then placed in an oven to dry the photoresist layer. Following the drying process, UV exposure is used to pattern the photoresist layer. A deionized (DI) rinse is performed to leave the desired trace pattern formed in the photoresist layer. Electroless plating is then performed to deposit conductive layer 146 in the patterned photoresist layer. The electroless plating is followed by a rinsing and drying process to remove the photoresist layer and leave patterned conductive layer 146 formed over bumps 114 and surface 144 of encapsulant 138.

Figure 3F:
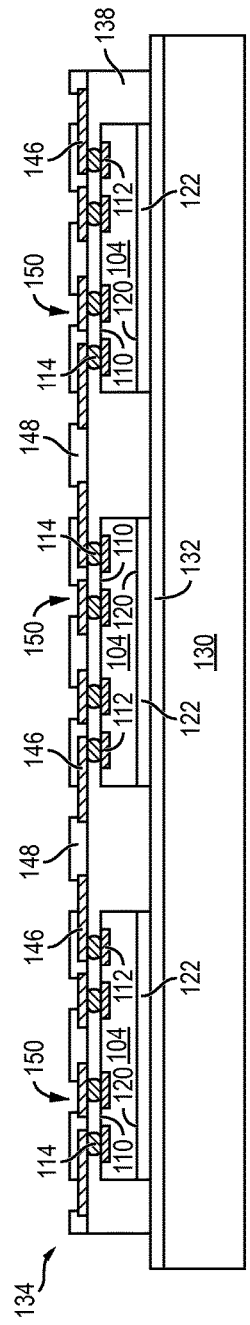

Turning to FIG. 3f, an insulating or passivation layer 148 is formed over encapsulant 138 and conductive layer 146 using PVD, CVD, printing, lamination, spin coating, spray coating, or other suitable application process. Insulating layer 148 contains one or more layers of solder resist, silicon dioxide ($SiO_2$), silicon nitride ($Si_3N_4$), silicon oxynitride (SiON), tantalum pentoxide ($Ta_2O_5$), aluminum oxide ($Al_2O_3$), hafnium oxide ($HfO_2$), benzocyclobutene (BCB), polyimide (PI), polybenzoxazoles (PBO), polymer, or other material having similar structural and insulating properties. A portion of insulating layer 148 is removed by LDA, etching, or other suitable process to form a plurality of openings 150 over conductive layer 146. Openings 150 expose conductive layer 146 for subsequent electrical interconnect.

In FIG. 3g, an electrically conductive bump material is deposited over conductive layer 146 in openings 150 using an evaporation, electrolytic plating, electroless plating, ball drop, or screen printing process. In one embodiment, the bump material is deposited with a ball drop stencil, i.e., no mask required. The bump material is Al, Sn, Ni, Au, Ag, Pb, Bi, Cu, solder, and combinations thereof, with an optional flux solution. For example, the bump material is eutectic Sn/Pb, high-lead solder, or lead-free solder. The bump material is bonded to conductive layer 146 using a suitable attachment or bonding process. The bump material is reflowed by heating the material above the material's melting point to form balls or bumps 152. In some applications, bumps 152 are reflowed a second time to improve electrical contact to conductive layer 146. Bumps 152 can also be compression bonded or thermocompression bonded to conductive layer 146. Bumps 152 represent one type of interconnect structure formed over conductive layer 146. The interconnect structure can also use conductive paste, stud bump, micro bump, or other electrical interconnect.

Reconstituted wafer 134 is then singulated using a saw blade or laser cutting tool 154 into individual semiconductor devices or packages 160. After singulation, semiconductor devices 160 are released from interface layer 132 using thermal baking, UV light, or mechanical peeling.

FIG. 4 shows semiconductor device 160 after singulation. Semiconductor die 104 is electrically connected through bumps 114 and conductive layer 146 to bumps 152 for external interconnect. Encapsulant 138 is deposited around semiconductor die 104 and backside protection layer 122. Releasing semiconductor die 104 from interface layer 132 exposes backside protection layer 122 and surface 156 of encapsulant 138. Surface 156 of encapsulant 138 is coplanar with the surface of backside protection layer 122.

Conductive layer 146 is formed over semiconductor die 104 and surface 144 of encapsulant 138. Conductive layer 146 allows signals from semiconductor die 104 to be rerouted across semiconductor device 160. A portion of conductive layer 146 extends horizontally along surface 144 of encapsulant 138, parallel to active surface 110 of semiconductor die 104 to laterally redistribute the electrical signal from bumps 114. Forming conductive layer 146 extending over encapsulant 138, i.e., extending outside a footprint of semiconductor die 104, provides greater flexibility in the location and design layout of bumps 152. For example, the pitch of bumps 152 is selected to mirror a substrate with industry standard input/output (I/O) density or the pitch and layout of bumps 152 is selected to match a substrate having a unique I/O density and pattern. The greater flexibility in interconnect layout makes semiconductor device 160 compatible with a greater number other devices. Further, forming a conductive layer 146 on encapsulant 138 and semiconductor die 104, as opposed to mounting semiconductor die 104 to a preformed interposer substrate, reduces an overall thickness or z-dimension of semiconductor device 160.

Backside protection layer 122 is formed on surface 120 of semiconductor die 104. Backside protection layer 122 strengthens and protects semiconductor die 104 within semiconductor device 160. Backside protection layer 122 environmentally protects semiconductor die 104 from external elements and provides rigidity and physical support to strengthen semiconductor die 104. Backside protection layer 122 decreases a likelihood that semiconductor die 104 will be damaged during handling or other manufacturing processes, e.g., during the deposition of encapsulant 138 or during formation of conductive layer 146. The throughput of good semiconductor devices 160 is increased due to backside protection layer 122 making semiconductor die 104 less susceptible to damage both during and after manufacturing.

Semiconductor device 160 has a reduced z-dimension because the thickness of semiconductor die 104 is reduced in the backgrinding operation shown in FIG. 1d. A greater portion of base substrate material 102 is removed from semiconductor die 104 because protection layer 116 supports semiconductor die 104 during the backgrinding and backside protection layer 122 supports semiconductor die 104 after backgrinding. Accordingly, an overall thickness of semiconductor die 104 and semiconductor device 160 is reduced. Encapsulated semiconductor die 104 having backside protection layer 122 makes a robust semiconductor device 160 with a reduced z-dimension.

FIG. 5 shows a semiconductor device 170. Semiconductor device 170 includes a semiconductor die 104 with an exposed back surface 120. Semiconductor die 104 is electrically connected through bumps 114 and conductive layer 146 to bumps 152 for external interconnect.

Conductive layer 146 is formed over semiconductor die 104 and surface 144 of encapsulant 138. Conductive layer 146 allows signals from semiconductor die 104 to be rerouted across semiconductor device 160. A portion of conductive layer 146 extends horizontally along surface 144 of encapsulant 138, parallel to active surface 110 of semiconductor die 104 to laterally redistribute the electrical signal from bumps 114. Forming conductive layer 146 extending over encapsulant 138, i.e., extending outside a footprint of semiconductor die 104, provides greater flexibility in the location and design layout of bumps 152. For example, the pitch of bumps 152 is selected to mirror a substrate with industry standard I/O density or the pitch and layout of bumps 152 is selected to match a substrate having a unique I/O density and pattern. The greater flexibility in interconnect layout makes semiconductor device 170 compatible with a greater number other devices. Further, forming a conductive layer 146 on encapsulant 138 and semiconductor die 104, as opposed to mounting semiconductor die 104 to a preformed interposer substrate, reduces an overall thickness or z-dimension of semiconductor device 170.

Semiconductor device 170 is formed by disposing semiconductor die 104 from FIG. 2c over carrier 130 with back surface 120 in contact with interface layer 132. Manufacturing then continues as shown in FIGS. 3b-3g. After releasing semiconductor die 104 from interface layer 132, back surface 120 of semiconductor die 104 is coplanar with surface 156 of encapsulant 138.

Semiconductor device 170 has a reduced z-dimension because the thickness of semiconductor die 104 is reduced in the backgrinding operation shown in FIG. 1d. A greater portion of base substrate material 102 is removed from semiconductor die 104 because protection layer 116 supports semiconductor die 104 during the backgrinding. Accordingly, an overall thickness of semiconductor die 104 and semiconductor device 170 is reduced. Exposed back surface 120 allows for greater heat dissipation from semiconductor die 104. Employing a semiconductor die 104 with an exposed back surface 120 also further reduces an overall thickness of semiconductor device 170.

FIG. 6 shows a semiconductor device 180, similar to semiconductor device 160 in FIG. 4, with a heat spreader 182 disposed over backside protection layer 122 and surface 156 of encapsulant 138. Alternatively, heat spreader 182 is disposed over a semiconductor die 104 with an exposed back surface 120, i.e., over a device similar to semiconductor device 170 in FIG. 5. Heat spreader 182 is Cu, Al, or other material with high thermal conductivity. In one embodiment, backside protection layer 122 is a thermal interface layer (TIM) disposed between heat spreader 182 and back surface 120 of semiconductor die 104 to facilitate the thermal connection and flow of heat from semiconductor die 104 to heat spreader 182. The TIM is aluminum oxide, zinc oxide, boron nitride, or pulverized silver. Heat spreader 182 aids in the distribution and dissipation of the heat generated by semiconductor die 104.

Heat spreader 182 is formed over semiconductor die 104 by laminating a conductive foil over carrier 130 and interface layer 132 prior to disposing semiconductor die 104 over the carrier. Semiconductor die 104 are then mounted to the conductive foil using a pick and place operation with bumps 114 oriented away from the conductive foil. Backside protection layer or TIM 122 includes an adhesive material to hold semiconductor die 104 in place over the conductive foil. The manufacturing process then continues as shown in FIGS. 3b-3g with cutting tool 154 cutting through encapsulant 138 and the conductive foil, i.e., heat spreader 182, to singulate reconstituted wafer 134 into individual semiconductor devices 180.

Alternatively, heat spreader 182 is formed over semiconductor die 104 and surface 156 of encapsulant 138 after removing reconstituted wafer 134 from interface layer 132 and carrier 130. After removing carrier 130 and interface layer 132, the conductive material of heat spreader 182 is deposited over semiconductor die 104 and surface 156 of encapsulant 138 using lamination, PVD, CVD, electrolytic plating, electroless plating process, or other suitable metal deposition process. Reconstituted wafer 134 with conductive material 182 formed over semiconductor die 104 and encapsulant 138 is then singulated into semiconductor devices 180. In one embodiment, a dicing tape or other support carrier is attached to reconstituted wafer 134 to support reconstituted wafer 134 during formation of heat spreader 182 and during singulation. Heat spreader 182 dissipates heat generated by semiconductor die 104 and increases the thermal performance and overall functionality of semiconductor device 180.

FIG. 7 shows a semiconductor device 190 with a semiconductor die 192 disposed over semiconductor die 104. Semiconductor die 104 has an exposed back surface 120. Alternatively, semiconductor die 192 is disposed over a semiconductor die 104 that has backside protection layer 122 formed over back surface 120.

Semiconductor die 192 has a back or non-active surface 193 and an active surface 194 containing analog or digital circuits implemented as active devices, passive devices, conductive layers, and dielectric layers formed within the die and electrically interconnected according to the electrical design and function of the die. For example, the circuit includes one or more transistors, diodes, and other circuit elements formed within active surface 194 to implement analog circuits or digital circuits, such as DSP, ASIC, MEMS, memory, or other signal processing circuit. Semiconductor die 192 also contains IPDs, such as inductors, capacitors, and resistors, for RF signal processing.

An electrically conductive layer 196 is formed over active surface 194 using PVD, CVD, electrolytic plating, electroless plating process, or other suitable metal deposition process. Conductive layer 196 includes one or more layers of Al, Cu, Sn, Ni, Au, Ag, Pd, SnAg, SnAgCu, CuNi, CuNiAu, CuNiPdAu, or other suitable electrically conductive material or combination thereof. Conductive layer 196 operates as contact pads electrically connected to the circuits on active surface 194. Contact pads 196 facilitate subsequent electrical interconnect between the active circuits within semiconductor die 192 and external devices.

An electrically conductive bump material is deposited over contact pads 196 using an evaporation, electrolytic plating, electroless plating, ball drop, or screen printing process. The bump material is Al, Sn, Ni, Au, Ag, Pb, Bi, Cu, solder, and combinations thereof, with an optional flux solution. For example, the bump material is eutectic Sn/Pb, high-lead solder, or lead-free solder. The bump material is bonded to contact pads 196 using a suitable attachment or bonding process. The bump material is reflowed by heating the material above the material's melting point to form balls or bumps 199. In some applications, bumps 199 are reflowed a second time to improve the electrical connection with contact pads 196. Bumps 199 can also be compression bonded or thermocompression bonded to contact pads 196. Bumps 199 represent one type of interconnect structure formed over contact pads 196. The interconnect structure can also use stud bump, micro bump, or other electrical interconnect.

A plurality of through silicon vias (TSV) 198 is formed through semiconductor die 192. TSV 198 extend from back surface 193 to active surface 194 of semiconductor die 192. TSV 198 are vertical interconnect structures that provide electrical interconnection between devices or components (e.g., semiconductor die 104) disposed over back surface 193 and devices or components (e.g., conductive layer 146) disposed over active surface 194.

Semiconductor die 192 is mounted to semiconductor die 104. Bumps 114 electrically and metallurgically connect semiconductor die 104 to TSV 198 of semiconductor die 192. Encapsulant 138 is deposited over and around semiconductor die 104 and semiconductor die 192. Encapsulant 138 flows around bumps 114 and between active surface 110 of semiconductor die 104 and back surface 193 of semiconductor die 192. In one embodiment, an underfill is deposited between active surface 110 of semiconductor die 104 and back surface 193 of semiconductor die 192 prior to depositing encapsulant 138.

Encapsulant 138 undergoes a grinding operation to expose bumps 199 and planarize surface 144 of encapsulant 138 with bumps 199. Conductive layer 146 is formed over bumps 199 and surface 144 of encapsulant 138. One portion of conductive layer 146 is electrically connected to bumps 199. Other portions of conductive layer 146 are electrically common or electrically isolated depending on the design and function of semiconductor die 104 and semiconductor die 192. Insulating layer 148 and bumps 152 are formed over conductive layer 146.

Semiconductor die 104 is electrically connected through bumps 114, TSV 198, bumps 199, and conductive layer 146 to bumps 152 for external interconnect. Semiconductor die 192 is electrically connected through bumps 199 and conductive layer 146 to bumps 152 for external interconnect. TSV 198 electrically connect semiconductor die 104 to semiconductor die 192.

Conductive layer 146 is formed over semiconductor die 192 and surface 144 of encapsulant 138. Conductive layer 146 allows signals from semiconductor die 104 and 192 to be rerouted across semiconductor device 190. A portion of conductive layer 146 extends horizontally along surface 144 of encapsulant 138, parallel to active surface 194 of semiconductor die 192 to laterally redistribute the electrical signal from bumps 199. Forming conductive layer 146 extending over encapsulant 138, i.e., extending outside a footprint of semiconductor die 192, provides greater flexibility in the location and design layout of bumps 152. For example, the pitch of bumps 152 is selected to mirror a substrate with industry standard I/O density or the pitch and layout of bumps 152 is selected to match a substrate having a unique I/O density and pattern. The greater flexibility in interconnect layout makes semiconductor device 190 compatible with a greater number of other substrates and devices. Further, forming a conductive layer 146 on encapsulant 138 and semiconductor die 192, as opposed to mounting semiconductor die 104 and 192 to a preformed interposer substrate, reduces an overall thickness or z-dimension of semiconductor device 190.

Semiconductor device 190 has a reduced z-dimension because the thickness of semiconductor die 104 is reduced in the backgrinding operation shown in FIG. 1d. A greater portion of base substrate material 102 is removed from semiconductor die 104 because protection layer 116 supports semiconductor die 104 during the backgrinding. Accordingly, an overall thickness of semiconductor die 104 and semiconductor device 190 is reduced. Disposing semiconductor die 192 with TSV 198 over semiconductor die 104 allows semiconductor device 190 to incorporate multiple semiconductor die with varying functions within a single package. Connecting multiple semiconductor die within semiconductor device 190 increases the electrical performance and overall functionality of semiconductor device 190.

FIGS. 8a-8h illustrate a method of making a semiconductor device having a protection layer disposed across a surface of the semiconductor device. FIG. 8a shows a cross-sectional view of a portion of a carrier or temporary substrate 200 containing sacrificial base material such as silicon, polymer, beryllium oxide, glass, or other suitable low-cost, rigid material for structural support. An interface layer or double-sided tape 202 is formed over carrier 200 as a temporary adhesive bonding film, etch-stop layer, or thermal release layer. Semiconductor die 104 from FIG. 2c are disposed over carrier 200 and interface layer 202 using, for example, a pick and place operation with backside surface 120 oriented toward and in contact with interface layer 202 of carrier 200.

FIG. 8b shows semiconductor die 104 mounted to interface layer 202 and carrier 200 as reconstituted or reconfigured wafer 204. Bumps 114 are oriented away from carrier 200. Semiconductor die 104 are held in place over carrier 200 by interface layer 202. A re-usable guard ring 206 is disposed around semiconductor die 104.

In FIG. 8c, an encapsulant or molding compound 208 is deposited over semiconductor die 104 and carrier 200 using screen printing, spray coating, paste printing, compressive molding, transfer molding, liquid encapsulant molding, vacuum lamination, spin coating, or other suitable application method. Encapsulant 208 is deposited over and around semiconductor die 104. Encapsulant 208 covers bumps 114, active surface 110, and the four side surfaces of semiconductor die 104. Encapsulant 208 includes polymer composite material, such as epoxy resin with filler, epoxy acrylate with filler, or polymer with proper filler. Encapsulant 208 is non-conductive and environmentally protects the semiconductor die 104 from external elements and contaminants.

In FIG. 8d, guard ring 206 is removed and surface 210 of encapsulant 208 undergoes a grinding operation to planarize encapsulant 208 and expose bumps 114. Grinder 212 removes a portion of encapsulant 208 from surface 210. The grinding operation reveals a portion of bumps 114 and leaves encapsulant 208 with a new planarized surface 214. After grinding, surface 214 is coplanar with the exposed surface of bumps 114.

In FIG. 8e, an electrically conductive layer 216 is formed over bumps 114 and surface 214 of encapsulant 208 using a patterning and metal deposition process such as printing, PVD, CVD, sputtering, electrolytic plating, and electroless plating. Conductive layer 216 is one or more layers of Al, Cu, Sn, Ni, Au, Ag, or other suitable electrically conductive material. One portion of conductive layer 216 is electrically connected to bumps 114. Other portions of conductive layer 216 are electrically common or electrically isolated depending on the design and function of semiconductor die 104. Conductive layer 216 operates as an RDL formed over semiconductor die 104. Conductive layer 216 provides a conductive path extending from bumps 114 to other areas over semiconductor die 104 and encapsulant 208.

In one embodiment, after exposing bumps 114, reconstituted wafer 204 is placed into a high-speed nano particle jet or laser printer. The traces of conductive layer 216 are then printed directly over bumps 114 and surface 214 in the desired patterned. Nano Cu or Ag traces are used to form conductive layer 216. After the printing is completed, the traces are cured or sintered to complete the formation of conductive layer 216. Alternatively, the traces are sintered simultaneously, i.e., in real-time, with the printing.

In another embodiment, after exposing bumps 114, a desmearing operation is performed on bumps 114 and surface 214 of encapsulant 208. After desmearing, encapsulated semiconductor die 104 are dried in an oven. After drying, an electroless plating operation is performed. Next, a dry film lamination process is performed, followed by dry film patterning and electro Cu-plating. The dry film is then removed and a flash etching and annealing process are performed to complete the formation of conductive layer 216.

In another embodiment, conductive layer 216 is formed by depositing a screen coating or photoresist layer across exposed bumps 114 and surface 214 of encapsulant 208 using spray coating, spin coating, or other suitable application process. Reconstituted wafer 204 is ten placed in an oven to dry the photoresist layer. Following the drying process, UV exposure is used to pattern the photoresist layer. A DI rinse is performed to leave the desired trace pattern formed in the photoresist layer. Electroless plating is then performed to deposit conductive layer 216 in the patterned photoresist layer. The electroless plating is followed by a rinsing and drying process to remove the photoresist layer and leave patterned conductive layer 216 formed over bumps 114 and surface 214 of encapsulant 208.

Turning to FIG. 8f, an insulating or passivation layer 218 is formed over encapsulant 208 and conductive layer 216 using PVD, CVD, printing, lamination, spin coating, spray coating, or other suitable application process. Insulating layer 218 contains one or more layers of solder resist, SiO2, Si3N4, SiON, Ta2O5, Al2O3, HfO2, BCB, PI, PBO, polymer, or other material having similar structural and insulating properties. A portion of insulating layer 218 is removed by LDA, etching, or other suitable process to form a plurality of openings over conductive layer 216. The openings in insulating layer 218 expose conductive layer 216 for subsequent electrical interconnect.

An electrically conductive bump material is deposited over conductive layer 216 in the openings in insulating layer 218 using an evaporation, electrolytic plating, electroless plating, ball drop, or screen printing process. In one embodiment, the bump material is deposited with a ball drop stencil, i.e., no mask required. The bump material is Al, Sn, Ni, Au, Ag, Pb, Bi, Cu, solder, and combinations thereof, with an optional flux solution. For example, the bump material is eutectic Sn/Pb, high-lead solder, or lead-free solder. The bump material is bonded to conductive layer 216 using a suitable attachment or bonding process. The bump material is reflowed by heating the material above the material's melting point to form balls or bumps 220. In some applications, bumps 220 are reflowed a second time to improve electrical contact to conductive layer 216. Bumps 220 can also be compression bonded or thermocompression bonded to conductive layer 216. Bumps 220 represent one type of interconnect structure formed over conductive layer 216. The interconnect structure can also use conductive paste, stud bump, micro bump, or other electrical interconnect.

In FIG. 8g, temporary carrier 200 and interface layer 202 are removed by chemical etching, mechanical peel-off, CMP, mechanical grinding, thermal bake, laser scanning, UV release, or wet stripping. Surface 221 of encapsulant 208 and back surface 120 of semiconductor die 104 are exposed after carrier 200 and interface layer 202 are removed.

A backside protection layer 222 is then formed over surface 120 of semiconductor die 104 and surface 221 of encapsulant 208. Backside protection layer 222 is formed by lamination, screen printing, spin coating, spray coating, or other suitable application method. Backside protection layer 222 is one or more layers of photosensitive polymer dielectric film with or without fillers, non-photosensitive polymer dielectric film, epoxy, epoxy resin, polymeric materials, polymer composite material such as epoxy resin with filler, epoxy acrylate with filler, or polymer with proper filler, thermoset plastic laminate, or other material having similar insulating and structural properties. Backside protection layer 222 is non-conductive and provides environmental protection and physical support to semiconductor die 104 and reconstituted wafer 204. Backside protection layer 222 can also provide heat dissipation to improve the thermal performance of the semiconductor device. Backside protection layer 222 can also provide warpage tuning capability to control overall package warpage.

In FIG. 8h, reconstituted wafer 204 is disposed over a temporary carrier 224 with backside protection layer 222 oriented toward the carrier. An optional interface layer or double-sided tape, similar to interface layer 202, can be disposed between backside protection layer 222 and the surface of carrier 224. In one embodiment, backside protection layer 222 is formed over carrier 224 and then reconstituted wafer 204 is mounted on protection layer 222 with surface 120 of semiconductor die 104 disposed on and in contact with protection layer 222.

Reconstituted wafer 204 is heated to cure backside protection layer 222. Reconstituted wafer 204 is then singulated using a saw blade or laser cutting tool 228 into individual semiconductor devices or packages 230. After singulation, semiconductor devices 230 are released from carrier 224 using thermal baking, UV light, or mechanical peeling.

FIG. 9 shows semiconductor device 230 after singulation. Semiconductor die 104 is electrically connected through bumps 114 and conductive layer 216 to bumps 220 for external interconnect. Conductive layer 216 is formed over semiconductor die 104 and surface 214 of encapsulant 208. A portion of conductive layer 216 extends horizontally along surface 214 of encapsulant 208, parallel to active surface 110 of semiconductor die 104 to laterally redistribute the electrical signal from bumps 114. Forming conductive layer 216 extending over encapsulant 208, i.e., extending outside a footprint of semiconductor die 104, provides greater flexibility in the location and design layout of bumps 220. For example, the pitch of bumps 220 is selected to mirror a substrate having an industry standard I/O density or the pitch and layout of bumps 220 is selected to match a substrate having a unique I/O density and pattern. The greater flexibility in interconnect layout makes semiconductor device 230 compatible with a greater number other substrates and devices. Forming conductive layer 216 on semiconductor die 104 and encapsulant 208, as opposed to mounting semiconductor die 104 to a preformed interposer substrate, reduces an overall thickness or z-dimension of semiconductor device 230.

Backside protection layer 222 is formed over semiconductor die 104 and encapsulant 208. Backside protection layer 222 covers back surface 120 of semiconductor die 104 and surface 221 of encapsulant 208. Backside protection layer 222 environmentally protects semiconductor die 104 from external elements and provides rigidity and physical support to strengthen semiconductor device 230. Semiconductor device 230 is less susceptible to damage during subsequent handling and processing due to the presence of backside protection layer 222. The overall functionality and throughput of good semiconductor devices 230 is increased due to backside protection layer 222 making semiconductor device 230 less susceptible to damage.

Semiconductor device 230 has a reduced z-dimension because the thickness of semiconductor die 104 is reduced in the backgrinding operation shown in FIG. 1d. A greater portion of base substrate material 102 is removed from semiconductor die 104 because protection layer 116 supports semiconductor die 104 during the backgrinding and backside protection layer 222 provides rigidity and strengthens semiconductor die 104 and device 230. Accordingly, an overall thickness of semiconductor die 104 and semiconductor device 230 is reduced. Semiconductor device 230 having encapsulated semiconductor die 104 and backside protection layer 222 covering an entire surface of semiconductor device 230 provides a robust semiconductor device with a reduced z-dimension.

FIG. 10 shows a semiconductor device 236, similar to device 190 in FIG. 7, with semiconductor die 192 disposed over semiconductor die 104. Backside protection layer 222 covers encapsulant 208 and back surface 120 of semiconductor die 104. Bumps 114 of semiconductor die 104 are electrically and metallurgically connected to TSV 198 of semiconductor die 192. Bumps 199 of semiconductor die 192 are electrically connected to conductive layer 216. Semiconductor die 104 is electrically connected through bumps 114, TSV 198, bumps 199, and conductive layer 216 to bumps 220 for external interconnect. Semiconductor die 192 is electrically connected through bumps 199 and conductive layer 216 to bumps 220 for external interconnect. TSV 198 electrically connected semiconductor die 104 and semiconductor die 192. Connecting multiple semiconductor die within the semiconductor device 236 increases the overall functionality of semiconductor device 236.

An underfill material 238 is deposited between active surface 110 of semiconductor die 104 and back surface 193 of semiconductor die 192 using a paste printing, jet dispense, compressive molding, transfer molding, liquid encapsulant molding, vacuum lamination, spin coating, mold underfill, or other suitable application process. Underfill 238 is epoxy, epoxy-resin adhesive material, polymeric materials, films, or other non-conductive materials. Underfill 238 is disposed around bumps 114. Underfill 238 is non-conductive and environmentally protects the semiconductor die from external elements and contaminants. Underfill 238 also increases bonding strength between semiconductor die 104 and semiconductor die 192.

Encapsulant 208 is deposited around underfill material 238, semiconductor die 104, and semiconductor die 192. A grinding operation is performed to reveal bumps 199 and planarize surface 214 of encapsulant 208 with bumps 199. Conductive layer 216 is formed over bumps 199 and surface 214 of encapsulant 208. One portion of conductive layer 216 is electrically connected to bumps 199. Other portions of conductive layer 216 are electrically common or electrically isolated depending on the design and function of semiconductor die 104 and 192.

Conductive layer 216 allows signals from semiconductor die 104 and 192 to be rerouted across semiconductor device 236. A portion of conductive layer 216 extends horizontally along surface 214 of encapsulant 208, parallel to active surface 194 of semiconductor die 192 to laterally redistribute the electrical signal from bumps 199. Forming conductive layer 216 extending over encapsulant 208, i.e., extending outside a footprint of semiconductor die 192, provides greater flexibility in the location and design layout of bumps 220. For example, the pitch of bumps 220 is selected to mirror a substrate with industry standard I/O density or the pitch and layout of bumps 220 is selected to match a substrate having a unique I/O density and pattern. The greater flexibility in interconnect layout makes semiconductor device 236 compatible with a greater number of other substrates and devices. Further, forming a conductive layer 216 on encapsulant 208 and semiconductor die 192, as opposed to mounting semiconductor die 104 and 192 to a preformed interposer substrate, reduces an overall thickness or z-dimension of semiconductor device 236.

Backside protection layer 222 covers the surface of encapsulant 208 and back surface 120 of semiconductor die 104. Backside protection layer 222 strengthens semiconductor device 236 and protects semiconductor die 104 from damage during subsequent handling and processing. Semiconductor device 236 is less susceptible to damage during subsequent handling and processing due to the presence of backside protection layer 222. The overall functionality and throughput of good semiconductor devices 236 is increased due to backside protection layer 222 making semiconductor device 236 less susceptible to damage.

Semiconductor device 236 has a reduced z-dimension because the thickness of semiconductor die 104 is reduced in the backgrinding operation shown in FIG. 1d. A greater portion of base substrate material 102 is removed from semiconductor die 104 because protection layer 116 supports semiconductor die 104 during the backgrinding and backside protection layer 222 provides rigidity and supports semiconductor die 104 within device 236. Accordingly, an overall thickness of semiconductor die 104 and semiconductor device 236 is reduced. Semiconductor device 236 having encapsulated semiconductor die 104 and 192 with backside protection layer 222 covering an entire surface of semiconductor device 236 provides a robust semiconductor device with a reduced z-dimension. Disposing semiconductor die 192 with TSV 198 over semiconductor die 104 allows semiconductor device 236 to incorporate multiple semiconductor die with varying functions within a single package. Connecting multiple semiconductor die within semiconductor device 236 increases the electrical performance and overall functionality of semiconductor device 236.

FIGS. 11a-11c illustrate a method of making a semiconductor device having conductive vias for electrically connecting stacked semiconductor devices. Continuing from FIG. 3f, after forming bumps 152 over conductive layer 146, temporary carrier 130 and interface layer 132 are removed by chemical etching, mechanical peel-off, CMP, mechanical grinding, thermal bake, laser scanning, UV release, or wet stripping, and reconstituted wafer 134 is mounted over a carrier or temporary substrate 240 and interface layer 242. FIG. 11a shows reconstituted wafer 134 disposed over carrier 240 and interface layer 242 with bumps 152 oriented toward and contacting interface layer 242. Carrier 240 contains sacrificial base material such as silicon, polymer, beryllium oxide, glass, or other suitable low-cost, rigid material for structural support. Interface layer or double-sided tape 242 is formed over carrier 240 as a temporary adhesive bonding film, etch-stop layer, or thermal release layer.

A plurality of vias 244 is formed through surface 156 of encapsulant 138 by LDA using laser 246. Alternatively, vias 244 are formed by mechanical drilling, deep reactive ion etching (DRIE), or other suitable formation process. Vias 244 extend completely through encapsulant 138 from surface 144 to surface 156.

In FIG. 11b, vias 244 are filled with Al, Cu, Sn, Ni, Au, Ag, Ti, W, or other suitable electrically conductive material using electrolytic plating, electroless plating process, or other suitable deposition process to form conductive vias 248. Conductive vias 248 extend completely through encapsulant 138 to provide electrical interconnection between surfaces 144 and 156 of encapsulant 138. A portion of conductive layer 146 is connected to conductive vias 248.

An electrically conductive layer or RDL 250 is formed over conductive vias 248 and surface 156 of encapsulant 138 using a patterning and metal deposition process such as printing, PVD, CVD, sputtering, electrolytic plating, and electroless plating. Conductive layer 250 includes one or more layers of Al, Cu, Sn, Ni, Au, Ag, or other suitable electrically conductive material. One portion of conductive layer 250 is electrically connected to conductive vias 248 and operates as contact pads electrically connected to conductive vias 248. Other portions of conductive layer 250 are electrically common or electrically isolated depending on the design and function of semiconductor die 104 and the semiconductor devices subsequently mounted over conductive layer 250.

In FIG. 11c, reconstituted wafer 134 is singulated using a saw blade or laser cutting tool 252 into individual semiconductor devices 260. After singulation, semiconductor devices 260 are released from carrier 240 and interface layer 242 using thermal baking, UV light, or mechanical peeling.

FIG. 12 shows semiconductor package 262 including stacked semiconductor devices 260. Bumps 152 of the top semiconductor device 260 are electrically and metallurgically connected to conductive layer 250 of the bottom semiconductor device 260. Conductive vias 248 electrically connect semiconductor die 104 within the top semiconductor device 260 to semiconductor die 104 within the bottom semiconductor device 260. Any number of semiconductor devices 260 can be stacked within semiconductor package 262. Top semiconductor device 260 includes contact pads 250 for additional device integration. Incorporating semiconductor device 260 as the top device within semiconductor package 262 creates an open stack configuration, i.e., a configuration that allows for additional semiconductor devices or components to be stacked over and electrically connected to top semiconductor device 260. Stacking multiple devices and components increases an overall electrical performance and functionality of semiconductor package 262.

Backside protection layer 122 is formed on surface 120 of semiconductor die 104. Backside protection layer 122 strengthens and protects semiconductor die 104 within semiconductor device 260. Backside protection layer 122 environmentally protects semiconductor die 104 and provides rigidity and physical support to strengthen semiconductor die 104. Backside protection layer 122 decreases a likelihood that semiconductor die 104 will be damaged during handling or other manufacturing processes, e.g., during the deposition of encapsulant 138 or during formation of conductive vias 248 and conductive layer 250. Backside protection layer 122 decreases a likelihood that semiconductor die 104 will be damaged during the stacking of semiconductor devices 260. The throughput of good semiconductor packages 262 is increased due to backside protection layer 122 making semiconductor die 104 and semiconductor devices 260 less susceptible to damage.

Semiconductor package 262 has a reduced z-dimension because the thickness of semiconductor die 104 is reduced in the backgrinding operation shown in FIG. 1d. A greater portion of base substrate material 102 is removed from semiconductor die 104 because protection layer 116 supports semiconductor die 104 during the backgrinding and backside protection layer 122 supports semiconductor die 104 after backgrinding. Accordingly, a thickness of semiconductor die 104 and semiconductor device 260 is reduced.

Reducing the thickness of semiconductor device 260 decreases the overall z-dimension of semiconductor package 262.

Forming conductive vias 248 through encapsulant 138 provides vertical interconnect through semiconductor devices 260. Forming semiconductor device 260 with vertical interconnect structures allows multiple semiconductor die and devices to be stacked within semiconductor package 262. Incorporating multiple semiconductor die and devices increases the overall electrical performance and functionality of semiconductor package 262.

FIG. 13 illustrates a semiconductor package 264 including semiconductor device 230 from FIG. 9 disposed over semiconductor device 260 from FIG. 11c. Bumps 220 of semiconductor device 230 are electrically and metallurgically connected to conductive layer 250 of semiconductor device 260. Semiconductor die 104 in semiconductor device 230 is electrically connected through bumps 114, conductive layer 216, bumps 220, conductive layer 250, TSV 248, and conductive layer 146 to bumps 152 for external interconnect. Conductive vias 248 provide vertical interconnect through semiconductor device 260 and electrically connect semiconductor die 104 in semiconductor device 230 to semiconductor die 104 in semiconductor device 260.

Incorporating semiconductor device 230 as the top semiconductor device within semiconductor package 264 creates a closed stack configuration, i.e., a configuration that does not allow for additional semiconductor devices or components to be stacked over and electrically connected to the top semiconductor device. However, any number of semiconductor devices 260 or other semiconductor components can be stacked between semiconductor device 230 and semiconductor device 260 or stacked over semiconductor device 260 opposite semiconductor device 230.

Backside protection layer 222 covers back surface 120 of semiconductor die 104 and the surface of encapsulant 208. Backside protection layer 222 environmentally protects semiconductor die 104 from external elements and provides rigidity and physical support to strengthen semiconductor device 230. Semiconductor device 230 is less susceptible to damage during handling and processing due to the presence of backside protection layer 222. For example, backside protection layer 222 decreases a likelihood that semiconductor device 230 will be damaged during attachment of semiconductor device 230 to semiconductor device 260. The overall functionality and throughput of good semiconductor packages 264 is increased due to backside protection layer 222 making semiconductor device 230 less susceptible to damage.

Backside protection layer 122 is formed on surface 120 of semiconductor die 104. Backside protection layer 122 strengthens and protects semiconductor die 104 within semiconductor device 260. Backside protection layer 122 decreases a likelihood that semiconductor die 104 will be damaged during handling or other manufacturing processes. Backside protection layer 122 also decreases a likelihood that semiconductor device 260 will be damaged during the attachment of semiconductor device 230 to semiconductor device 260. The throughput of good semiconductor packages 264 is increased due to backside protection layer 122 making semiconductor device 260 less susceptible to damage.

Semiconductor package 264 has a reduced z-dimension because the thickness of semiconductor die 104 within semiconductor devices 230 and 260 is reduced in the backgrinding operation shown in FIG. 1d. A greater portion of base substrate material 102 is removed from semiconductor die 104 because protection layer 116 supports semiconductor die 104 during the backgrinding and backside protection layers 122 and 222 provide rigidity and support semiconductor die 104 after backgrinding. Accordingly, a thickness of semiconductor die 104 and semiconductor devices 230 and 260 is reduced. Reducing the thickness of semiconductor devices 230 and 260 decreases the overall z-dimension of semiconductor package 264.

Conductive vias 248 formed through encapsulant 138 provide vertical interconnection through semiconductor device 260. Forming semiconductor device 260 with vertical interconnect structures allows semiconductor device 230 to be stacked over semiconductor device 260. Incorporating multiple semiconductor devices within semiconductor package 264 increases the electrical performance and overall functionality of semiconductor package 262.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
providing a semiconductor wafer including a plurality of bumps formed over the semiconductor wafer;
forming a first protection layer over the semiconductor wafer opposite the bumps;
singulating the semiconductor wafer into a plurality of first semiconductor die after forming the first protection layer;
disposing the plurality of first semiconductor die on a carrier after singulating the semiconductor wafer with the first protection layer oriented toward the carrier and the bumps oriented away from the carrier;
depositing an encapsulant over the first semiconductor die and carrier, wherein a back surface of the encapsulant is coplanar with a surface of the first protection layer;
planarizing the encapsulant to expose the bumps, wherein planarizing the encapsulant results in a surface of the encapsulant that is coplanar with a surface of the bumps; and
forming a conductive layer directly on the surface of the bumps and the surface of the encapsulant, wherein a portion of the conductive layer extends from a first bump of the plurality of bumps to outside a footprint of the semiconductor die.

2. The method of claim 1, further including:
backgrinding the semiconductor wafer to leave a new backside surface of the semiconductor wafer; and
forming the first protection layer directly on the new backside surface.

3. The method of claim 1, further including disposing a second semiconductor die over the first semiconductor die.

4. The method of claim 3, further including forming a conductive via through the second semiconductor die.

5. The method of claim 1, further including forming a conductive via through the encapsulant over the conductive layer.

6. The method of claim 1, further including:
forming a second protection layer over the bumps; and
removing the second protection layer prior to depositing the encapsulant.

7. The method of claim 1, further including:
forming an insulating layer over the conductive layer;
forming an opening in the insulating layer to expose the conductive layer; and depositing a bump material in the opening of the insulating layer directly on the conductive layer.

8. The method of claim 7, further including forming the opening in the insulating layer outside of the footprint of the first semiconductor die.

9. The method of claim 7, further including forming a conductive via through the encapsulant over the opening in the insulating layer.

10. A method of making a semiconductor device, comprising:
 providing a first semiconductor die including a conductive bump formed on an active surface of the first semiconductor die;
 forming a first protection layer over the first semiconductor die;
 disposing the first semiconductor die over a carrier with the conductive bump oriented away from the carrier;
 depositing an encapsulant over the first semiconductor die and carrier;
 planarizing the encapsulant to expose the conductive bump, wherein planarizing the encapsulant results in a surface of the encapsulant that is coplanar with a surface of the conductive bump; and
 forming a first conductive layer over the encapsulant and connected to the conductive bump, wherein the first conductive layer extends outside a footprint of the first semiconductor die.

11. The method of claim 10, further including disposing a heat spreader over the first protection layer and encapsulant.

12. The method of claim 10, further including forming a second protection layer over the first semiconductor die opposite the first protection layer.

13. The method of claim 12, further including removing a portion of first semiconductor die opposite the second protection layer.

14. The method of claim 10, further including forming a conductive via through the encapsulant.

15. The method of claim 14, further including forming a second conductive layer over a second surface of the encapsulant opposite the first conductive layer with the conductive via extending from the first conductive layer to the second conductive layer.

16. The method of claim 10, further including disposing a second semiconductor die including a conductive via formed through the second semiconductor die over the first semiconductor die.

17. A method of making a semiconductor device, comprising:
 providing a first semiconductor die;
 disposing the first semiconductor die on a carrier;
 depositing an encapsulant over the first semiconductor die and carrier, wherein the encapsulant substantially covers an active surface and a side surface of the semiconductor die;
 planarizing the encapsulant over the active surface of the first semiconductor die; and
 forming a conductive layer over the encapsulant and electrically connected to the semiconductor die.

18. The method of claim 17, further including forming a protection layer over the first semiconductor die.

19. The method of claim 18, further including forming the protection layer extending over the encapsulant.

20. The method of claim 17, further including forming a conductive via through the encapsulant.

21. The method of claim 17, further including disposing a heat spreader over the first semiconductor die.

22. The method of claim 17, wherein a surface of the first semiconductor die is coplanar with a surface of the encapsulant.

23. The method of claim 17, further including disposing a second semiconductor die over the first semiconductor die.

24. The method of claim 18, further including:
 forming the protection layer over an active surface of the first semiconductor die; and
 backgrinding the first semiconductor die after forming the protection layer.

25. The method of claim 24, further including removing the protection layer prior to depositing the encapsulant.

\* \* \* \* \*